(12) United States Patent
Breejen et al.

(10) Patent No.: US 10,950,766 B2
(45) Date of Patent: *Mar. 16, 2021

(54) LIGHT GUIDE WITH PATTERNED INK

(71) Applicant: Lumileds LLC, San Jose, CA (US)

(72) Inventors: Jeroen Den Breejen, San Jose, CA (US); Xin Zhang, San Jose, CA (US); Frederic Stephane Diana, Santa Clara, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/860,892

(22) Filed: Apr. 28, 2020

(65) Prior Publication Data

US 2020/0259053 A1 Aug. 13, 2020

Related U.S. Application Data

(63) Continuation of application No. 16/534,684, filed on Aug. 7, 2019, which is a continuation of application (Continued)

(30) Foreign Application Priority Data

Feb. 13, 2017 (EP) .................................. 17155827

(51) Int. Cl.
*H01L 33/58* (2010.01)
*F21V 8/00* (2006.01)

(52) U.S. Cl.
CPC ............ *H01L 33/58* (2013.01); *G02B 6/0021* (2013.01); *G02B 6/0043* (2013.01);
(Continued)

(58) Field of Classification Search
CPC ............ H01L 33/58; H01L 2933/0091; G02B 6/0043; G02B 6/0063
See application file for complete search history.

(56) References Cited

U.S. PATENT DOCUMENTS 8,640,368 B2 2/2014 Sato et al.
9,201,269 B2 12/2015 Huang
(Continued)

FOREIGN PATENT DOCUMENTS

CN 102112802 A 6/2011
CN 102661544 A 9/2012
(Continued)

OTHER PUBLICATIONS

"U.S. Appl. No. 15/785,340, Non Final Office Action dated Dec. 31, 2018", 8 pgs.
(Continued)

*Primary Examiner* — Mary Ellen Bowman
(74) *Attorney, Agent, or Firm* — Schwegman Lundberg & Woessner, P.A.

(57) ABSTRACT

A light-emitting device comprising: a light source; and a light guide that is optically coupled to the light source, the light guide including a plurality of first non-fluorescent light extraction elements and a plurality of second non-fluorescent light extraction elements that are printed on the light guide, each of the first light extraction elements having a reflectance that is higher than a reflectance of any of the second light extraction elements, each of the first light extraction elements having a light transmittance that is lower than a light transmittance of any the second light extraction elements, each of the first light extraction elements having the same shape and size as any other one of the plurality first light extraction elements, and each of the second light extraction elements having the same shape and size as any other one of the plurality of second light extraction elements.

20 Claims, 13 Drawing Sheets

Related U.S. Application Data

No. 15/785,340, filed on Oct. 16, 2017, now Pat. No. 10,418,534.

(60) Provisional application No. 62/432,488, filed on Dec. 9, 2016.

(52) U.S. Cl.
CPC .......... *G02B 6/0065* (2013.01); *G02B 6/0063* (2013.01); *H01L 2933/0091* (2013.01)

(56) References Cited

U.S. PATENT DOCUMENTS

| | | | |
|---|---|---|---|
| 10,418,534 B2* | 9/2019 | Den Breejen | H01L 33/58 |
| 10,680,148 B2 | 6/2020 | Breejen et al. | |
| 2009/0168458 A1 | 7/2009 | Lai et al. | |
| 2011/0025448 A1* | 2/2011 | Muench, Jr. | H01H 85/143 337/208 |
| 2011/0205448 A1 | 8/2011 | Takata | |
| 2012/0163019 A1 | 6/2012 | Sekiguchi et al. | |
| 2014/0307466 A1 | 10/2014 | Hikmet et al. | |
| 2016/0062026 A1* | 3/2016 | Huang | G02B 6/0068 349/65 |
| 2016/0131820 A1 | 5/2016 | Lin et al. | |
| 2016/0178829 A1* | 6/2016 | Hayashihara | G02B 6/0063 362/606 |
| 2018/0164495 A1 | 6/2018 | Den Breejen et al. | |
| 2019/0363229 A1 | 11/2019 | Breejen et al. | |

FOREIGN PATENT DOCUMENTS

| | | |
|---|---|---|
| CN | 202791385 U | 3/2013 |
| CN | 104460109 A | 3/2015 |
| CN | 105093383 A | 11/2015 |
| CN | 105911634 A | 8/2016 |
| CN | 205691810 U | 11/2016 |
| CN | 110446887 A | 11/2019 |
| EP | 1715244 A1 | 10/2006 |
| TW | 201502665 A | 1/2015 |
| TW | 201508357 A | 3/2015 |
| TW | 201833475 A | 9/2018 |
| WO | WO-2011055847 A1 | 5/2011 |
| WO | WO-2018106348 A1 | 6/2018 |

OTHER PUBLICATIONS

"U.S. Appl. No. 15/785,340, Notice of Allowance dated May 6, 2019", 7 pgs.
"U.S. Appl. No. 15/785,340, Response filed Mar. 21, 2019 to Non Final Office Action dated Dec. 31, 2018", 13 pgs.
"U.S. Appl. No. 16/534,684, Non Final Office Action dated Sep. 20, 2019", 5 pgs.
"U.S. Appl. No. 16/534,684, Notice of Allowance dated Jan. 29, 2020", 7 pgs.
"U.S. Appl. No. 16/534,684, Response filed Dec. 17, 2019 to Non Final Office Action dated Sep. 20, 2019", 8 pgs.
"Chinese Application Serial No. 201780086148.3, Office Action dated Feb. 28, 2020", (w/ English Translation), 16 pgs.
"International Application Serial No. PCT/US2017/057899, International Preliminary Report on Patentability dated Jun. 20, 2019", 12 pgs.
"International Application Serial No. PCT/US2017/057899, International Search Report dated Feb. 5, 2018", 7 pgs.
"International Application Serial No. PCT/US2017/057899, Written Opinion dated Feb. 5, 2018", 10 pgs.
"Japanese Application Serial No. 2019-530719, Voluntary Amendment Filed Aug. 9, 2019", w/English Claims, 9 pgs.
U.S. Appl. No. 15/785,340, U.S. Appl. No. 10/418,534, filed Oct. 16, 2017, Light Guide With Patterned Ink.
U.S. Appl. No. 16/534,684, filed Aug. 7, 2019, Light Guide With Patterned Ink.
"Chinese Application Serial No. 201780086148.3, Response filed Jul. 13, 2020 to Office Action dated Feb. 28, 2020", w/ English Claims, 14pgs.
"Taiwanese Application Serial No. 106139812, Office Action dated Dec. 17, 2020", (w/ English Translation), 12 pgs.

\* cited by examiner

LIGHT GUIDE WITH PATTERNED INK

CROSS REFERENCE TO RELATED APPLICATION(S)

This application is a continuation of U.S. patent application Ser. No. 16/534,684, filed on Aug. 7, 2019, which is a continuation of U.S. patent application Ser. No. 15/785,340, filed on Oct. 16, 2017, which claims the benefit of U.S. Patent Provisional Application No. 62/432,488, filed on Dec. 9, 2016. This application also claims the benefit of priority to European Patent Application No. 17155827.3, filed on Feb. 13, 2017. All above-listed applications are incorporated by reference in their entireties.

FIELD OF INVENTION

The present disclosure relates to light emitting devices in general, and more particularly, to a light guide with patterned ink.

BACKGROUND

Light emitting diodes ("LEDs") are commonly used as light sources in various applications. LEDs are more energy-efficient than traditional light sources, providing much higher energy conversion efficiency than incandescent lamps and fluorescent light, for example. Furthermore, LEDs radiate less heat into illuminated regions and afford a greater breadth of control over brightness, emission color and spectrum than traditional light sources. These characteristics make LEDs an excellent choice for various lighting applications, such as outdoor lighting, decorative lighting, or outdoor lighting.

Different applications require different light distribution patterns. This necessitates LEDs to be paired with the appropriate light fixture when used for indoor or outdoor lighting. For example, some indoor lighting applications may require light emissions in both the upward and downward directions, whereas others may require a light emission to be produced only in the downward direction. As another example, some outdoor lighting applications may require light emissions that are more broadly spread than others. Accordingly, the need exists for LED-based light fixture designs that are capable of producing a wide variety of light distribution patterns without major modification.

SUMMARY

The present disclosure addresses this need. According to aspects of the disclosure, a light-emitting device is disclosed comprising: a light source; and a light guide that is optically coupled to the light source, the light guide including a plurality of first non-fluorescent light extraction elements and a plurality of second non-fluorescent light extraction elements that are printed on the light guide, each of the first light extraction elements having a reflectance that is higher than a reflectance of any of the second light extraction elements, each of the first light extraction elements having a light transmittance that is lower than a light transmittance of any the second light extraction elements, each of the first light extraction elements having the same shape and size as any other one of the plurality first light extraction elements, and each of the second light extraction elements having the same shape and size as any other one of the plurality of second light extraction elements.

BRIEF DESCRIPTION OF THE DRAWINGS

The drawings described below are for illustration purposes only. The drawings are not intended to limit the scope of the present disclosure. Like reference characters shown in the figures designate the same parts in the various embodiments.

DETAILED DESCRIPTION

Figure 1:
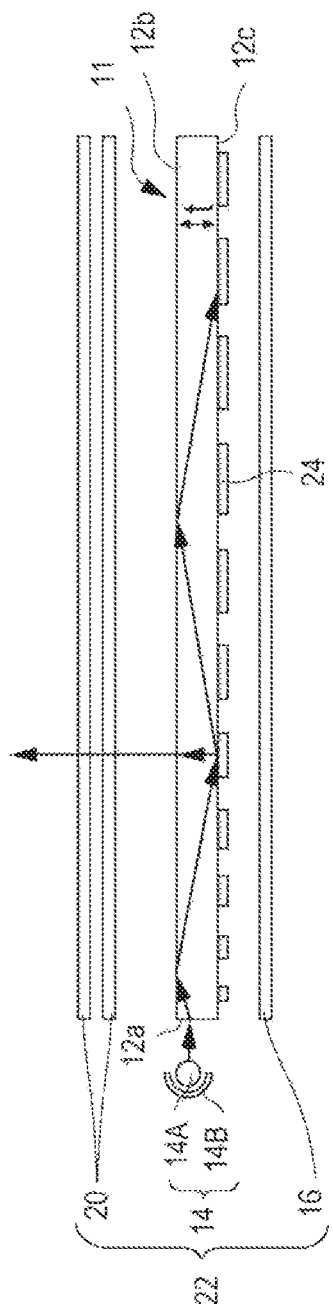
FIG. 1 is a schematic side view of an example of a light fixture, according to the prior art.

According to aspects of the disclosure, an improved light fixture is disclosed comprising a light guide that has at least two different types of light extraction elements (e.g., Gaussian dots) printed thereon. The two types of light extraction elements may differ from one another in at least one of the following characteristics: (1) light transmissivity, (2) light reflectance, (3) size, (4) shape, (5) distribution density, and (6) color. The light extraction elements may be printed on the surface(s) of the light guide by using different types of ink.

According to aspects of the disclosure, the improved light fixture may produce a wide variety of light distribution patterns without major modification. By adjusting the (1) spatial arrangement, (2) distribution density, (3) relative locations, and/or (4) relative size of different types of light extraction elements that are printed on the fixture's light guide, many different light distribution patterns can be achieved. In this regard, the light distribution pattern produced by the improved light fixture may be changed by simply printing a different light extraction pattern on the fixture's light guide. This permits the light fixture to produce a wide variety of light distribution patterns without major structural modifications.

According to aspects of the disclosure, the improved light fixture may use reflector(s) to further shape the effect of the light extraction elements that are printed on the fixture's light guide. For example, in some implementations, a single reflector may be placed on one surface of the light guide to reflect all light that is extracted by the light extraction elements in the same direction. As another example, in some implementations, one reflector may be placed on a portion of one surface of the light guide to force light extracted by one type of light extraction elements in a first direction, while another reflector may be placed on a portion of a second surface of the light guide to force light extracted by a second type of light extraction elements in a second direction that is opposite to the first direction.

According to aspects of the disclosure, a light-emitting device is disclosed comprising: a light source; and a light guide that is optically coupled to the light source, the light guide including a plurality of first non-fluorescent light extraction elements and a plurality of second non-fluorescent light extraction elements that are printed on the light guide, each of the first light extraction elements having a reflectance that is higher than a reflectance of any of the second light extraction elements, each of the first light extraction elements having a light transmittance that is lower than a light transmittance of any the second light extraction elements, each of the first light extraction elements having the same shape and size as any other one of the plurality first light extraction elements, and each of the second light extraction elements having the same shape and size as any other one of the plurality of second light extraction elements.

According to aspects of the disclosure, a light-emitting device is disclosed comprising: a light source; and a light guide that is optically coupled to the light source, the light guide including first group of first light extraction elements printed on the light guide adjacently to a first edge of the light guide, a second group of first light extraction elements printed adjacently to a second edge of the light guide that is opposite the first edge, and a third group of second light extraction elements printed on the light guide between the first group and the second group, each of the first light extraction elements having a reflectance that is higher than a reflectance of any of the second light extraction elements, and each of the first light extraction elements having a light transmittance that is lower than a light transmittance of any the second light extraction elements.

A light-emitting device is disclosed comprising: a light source; and a light guide that is optically coupled to the light source, the light guide including a first grid pattern of first light extraction elements that is printed on the light guide, and a second grid pattern of second light extraction elements, at least some of the second light extraction elements being positioned in an interstice between four different second light extraction elements, each of the second light extraction elements being greater in size than any of the first light extraction elements, each of the first light extraction elements having a reflectance that is higher than a reflectance of any of the second light extraction elements, and each of the first light extraction elements having a light transmittance that is lower than a light transmittance of any the second light extraction elements.

Examples of different systems will be described more fully hereinafter with reference to the accompanying drawings. These examples are not mutually exclusive, and features found in one example can be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

FIG. 1 is a diagram of an example of a light fixture 22, according to the prior art. The fixture includes a light guide plate 11 having a plurality of light scattering dots 24 printed on a surface 12c of the light guide plate. A reflective film 16 is placed over the light scattering dots 24 to reflect light in an upwards direction towards a surface 12b of the light guide plate 11. An optical film 20 is positioned on the surface 12b of the light guide plate 11 to condition any light that exits the surface 12b. The optical film 20 may include a diffusion film, a prism film, and/or a brightness enhancement film. A light source 14 is coupled to the edge 12a of the light fixture 22, as shown. The light source 14 may include a light source part 14A (e.g., a light-emitting diode) and a reflector 14B arranged to face the edge 12a of the light fixture 22.

Figure 2:
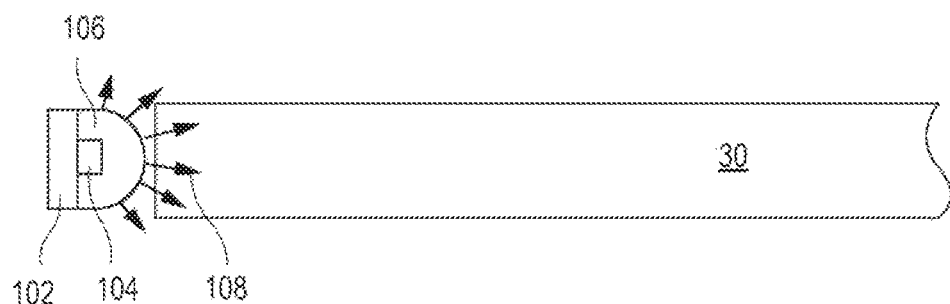
FIG. 2 is a schematic side view of an example of a light fixture, according to aspects of the disclosure.

FIG. 2 is a diagram of an example of a light fixture including a light guide 30, according to aspects of the disclosure. In this example, a light source is edge-coupled to the light guide 30, as shown. The light source includes an LED chip 104 that is disposed on a mount 102 and arranged to face in the direction of the edge of the light guide 30, as shown. A lens 106 may be disposed between the LED chip 104 and the light guide 30 to extract light 108 emitted from the LED chip 104 substantially uniformly in all directions except in the direction that is opposite the LED chip from the lens.

Figure 3:
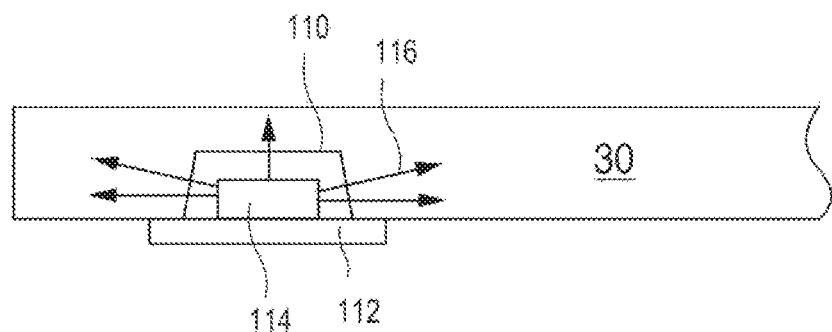
FIG. 3 is a schematic side view of an example of a light fixture, according to aspects of the disclosure.

FIG. 3 is a diagram of another example of a light fixture that includes the light guide 30. In this example, a light source is disposed in a cavity 110 formed in the light guide 30, as shown. The light source includes an LED chip 114 that is arranged on a mount 112. The mount 112 is disposed over the opening of the cavity 110, such that the LED chip 114 fits entirely within the cavity. In operation, the LED chip 114 emits light 116 which may enter the light guide 30 through the walls of the cavity.

As illustrated in FIGS. 2 and 3, LEDs can either be edge-coupled to the light guide 30 or disposed in a cavity that is formed in the light guide 30. Although the fixtures shown in FIGS. 2 and 3 include only one LED, it can be readily appreciated that alternative implementations are possible in which a larger number of LEDs are included in either one of the fixtures. In this regard, the present disclosure is not limited to any specific number of LEDs and/or a manner of coupling the LEDs to the light guide 30 in different light guide assemblies that are discussed further below.

According to aspects of the disclosure, the light guide 30 may include a plate having a thickness between 1 mm and 8 mm. The plate may be formed of glass, plastic, PMMA, polycarbonate, and/or any other suitable type of material. Moreover, in some implementations, the light guide may be formed of a material that is transparent and/or non-degrading when subjected to desired operating conditions. The plate may have two major surfaces and a plurality of edges. In some implementations, during normal operation of the light guide, light may be emitted from one or both of the major surfaces of the light guide, while the edges may optionally be hidden inside a housing enclosure, a trim, and/or any other suitable element.

According to aspects of the disclosure, the light guide 30 may be provided with different light extraction patterns, examples of which are depicted in FIGS. 4A-15. Those extraction patterns may each include light extraction elements 36 and light extraction elements 38. In some implementations, each of the light extraction elements 38 may have 45% light reflectance and 55% light transmittance and a 15° Gaussian diffusion pattern. Additionally or alternatively, in some implementations, each of the light extraction elements 36 may have 90% light reflectance and 10% light transmittance. As is discussed further below, the light extraction elements 36 and 38 may alter the pattern in which light travels through the light guide 30, such that the light is extracted in a preferred direction and/or in a preferred emission pattern.

The light extraction elements 36 and 38 may be printed on one or more of the major surfaces of the light guide 30 (e.g., surfaces 32 and/or 34). The light extraction elements 36 may be printed using a first ink, and the light extraction elements 38 may be printed using a second ink. In some implementations, the second ink may have 45% light reflectance and 55% light transmittance, and a 15° Gaussian diffusion pattern. Additionally or alternatively, in some implementations, the first ink may have 90% light reflectance and 10% light transmittance. The light extraction elements 36 and 38 may be printed using any suitable type of printing technology, such as ink jet printing.

The light extraction elements 36 and/or 38 may have any suitable type of shape. For example, each of the light extraction elements 36 in a given light fixture (or light guide) may have a circular shape and diameter in the range of 0.01 mm to 3 mm. Additionally or alternatively, each of the light extraction elements 38 in a given light fixture (or light guide) may have a circular shape and diameter in the range of 0.01 mm to 3 mm. In some implementations, the light extraction elements 36 and 38 in a given light fixture (or light guide) may have the same shape. Additionally or alternatively, in some implementations, the light extraction elements 36 and 38 in a given light fixture (or light guide) may have different shapes. In some implementations, the light extraction elements 36 and 38 in a given light fixture (or light guide) may be the same size. Additionally or alternatively, in some implementations, the light extraction elements 36 in a given light fixture (or light guide) may be smaller or larger than the light extraction elements 38 in the same fixture. FIGS. 4A-15, which are discussed further below, illustrate examples of different light extraction patterns that can be constructed by mixing the light extraction elements 36 and 38.

More specifically, FIGS. 4A-15, which are discussed further below, provide examples of different light guide assemblies. These light guide assemblies include a light guide 30 and various light extraction patterns that are printed on the light guide 30. The light sources (e.g., LEDs) that are used to inject light into the light guide assemblies are omitted for clarity. However, it will be understood that any suitable arrangement for introducing light into the light guide assemblies may be used. The present disclosure, is thus not limited to the techniques for injecting light into a light guide, examples of which are illustrated in FIGS. 2 and 3. Furthermore, it will be noted that depictions of light reflectors are omitted from top-down views of light guide assemblies which include such reflectors in order to reveal light extraction patterns that are formed underneath the reflectors. Light rays emitted from the guide light assemblies are depicted as arrows originating from the light guide assemblies.

Figure 4A:
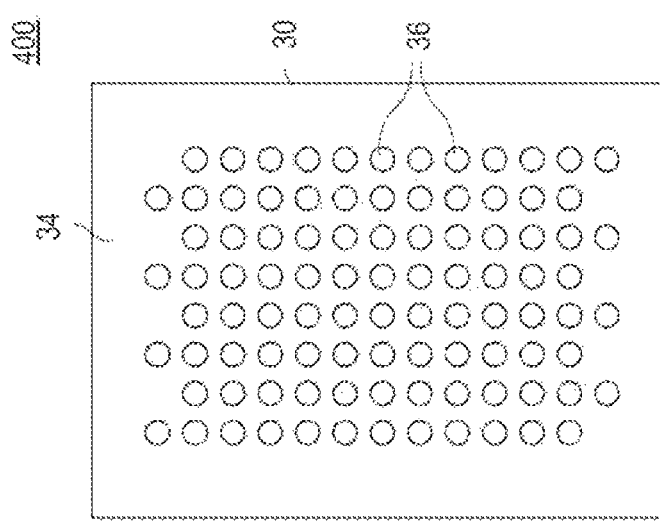
FIG. 4A is a schematic top-down view of an example of a light guide assembly, according to aspects of the disclosure.
Figure 4B:
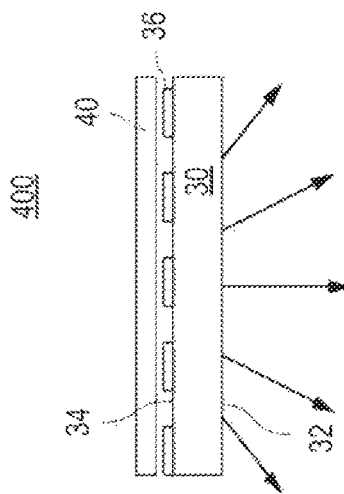
FIG. 4B is a schematic side view of the light guide assembly of FIG. 4A, according to aspects of the disclosure.
Figure 4C:
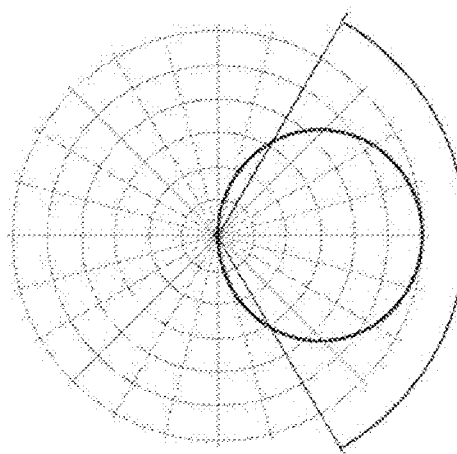
FIG. 4C is a candela diagram illustrating a light distribution pattern produced by the light guide assembly of FIG. 4A, according to aspects of the disclosure.

FIGS. 4A-B are diagrams of an example of a light guide assembly 400, according to aspects of the disclosure. The light guide assembly 400 includes a light guide 30 and a diffusive reflector 40 disposed adjacently to a surface 34 of the light guide 30. A plurality of light extraction elements 36 are formed on the surface 34 between the light guide 30 and the diffusive reflector 40. FIG. 4C is a candela diagram showing the light distribution pattern produced by the light guide assembly 400. As illustrated, the light guide assembly 400 is configured to produce a Lambertian light distribution pattern in the downward direction.

Figure 5C:
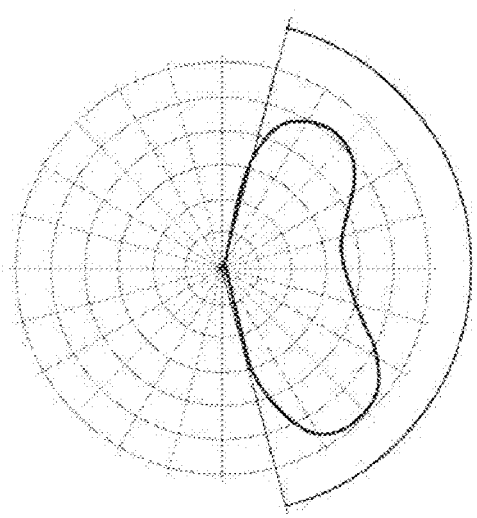
FIG. 5C is a candela diagram illustrating a light distribution pattern produced by the light guide assembly of FIG. 5A, according to aspects of the disclosure.
Figure 5B:
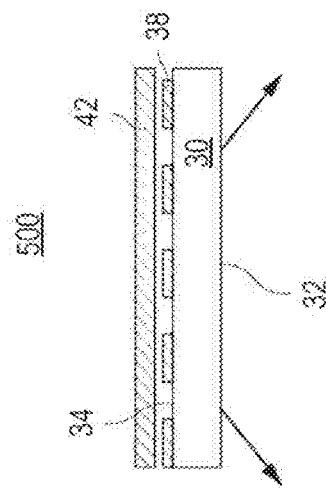
FIG. 5B is a schematic side view of the light guide assembly of FIG. 5A, according to aspects of the disclosure.
Figure 5A:
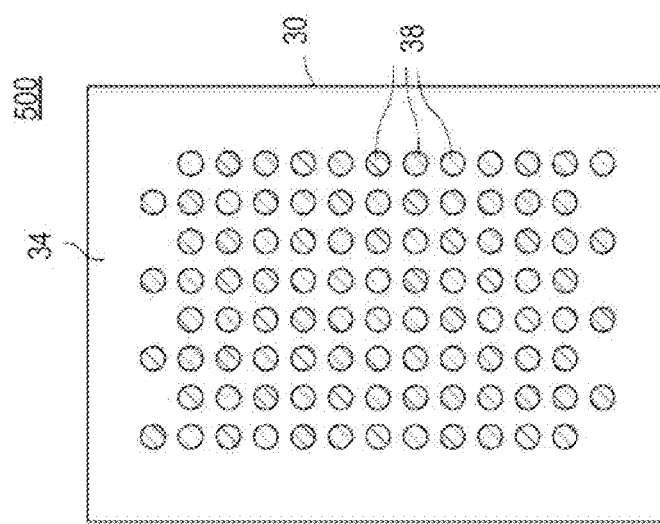
FIG. 5A is a schematic top-down view of an example of a light guide assembly, according to aspects of the disclosure.

FIGS. 5A-B are diagrams of an example of a light guide assembly 500, according to aspects of the disclosure. The light guide assembly 500 includes a light guide 30 and a specular reflector 42 disposed adjacently to a surface 34 of the light guide 30. A plurality of light extraction elements 38 are formed on the surface 34 between the light guide 30 and the specular reflector 42. FIG. 5C is a candela diagram showing the light distribution pattern produced by the light guide assembly 500. As illustrated, the light guide assembly 500 is configured to produce a batwing light distribution pattern in the downward direction.

Each of the light guide assemblies 400 and 500 uses only one type of light extraction elements. The light guide assembly 400 includes only light extraction elements 36, whereas the light guide assembly 600 includes only light extraction elements 38. In some aspects, the difference in the resultant light distribution patterns produced by the light guide assemblies 400 and 500, respectively, is at least in part attributable to the type of light extraction elements used in each light guide assembly. Specifically, when the light extraction elements 36 are used alone, they tend to produce a Lambertian light distribution pattern. By contrast, when the light extraction elements 38 are used alone, they tend to produce a batwing light distribution pattern.

Figure 6C:
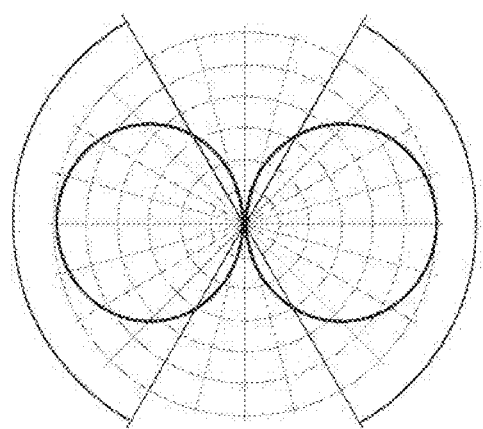
FIG. 6C is a candela diagram illustrating a light distribution pattern produced by the light guide assembly of FIG. 6A, according to aspects of the disclosure.
Figure 6B:
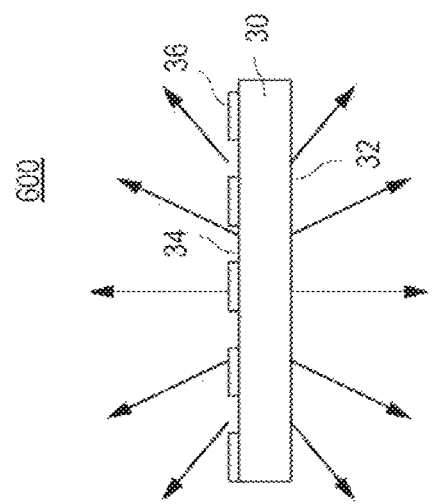
FIG. 6B is a schematic side view of the light guide assembly of FIG. 6A, according to aspects of the disclosure.
Figure 6A:
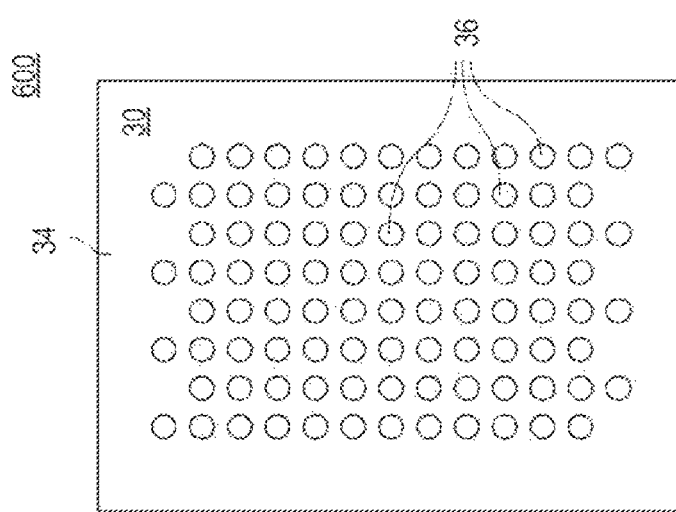
FIG. 6A is a schematic top-down view of an example of a light guide assembly, according to aspects of the disclosure.

FIGS. 6A-B are diagrams of an example of a light guide assembly 600, according to aspects of the disclosure. The light guide assembly 600 includes a light guide 30 and a plurality of light extraction elements 36 formed on the surface 34 of the light guide 30, as shown. FIG. 6C is a candela diagram showing the light distribution pattern produced by the light guide assembly 600. As illustrated, the light guide assembly 600 is configured to produce a Lambertian light distribution pattern in both the upward and downward directions. This is in contrast to the light guide assembly 500 which uses a diffusive reflector to force all emitted light in the downward direction.

Figure 7C:
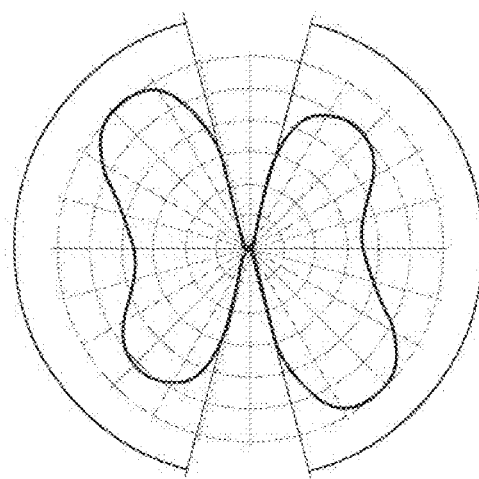
FIG. 7C is a candela diagram illustrating a light distribution pattern produced by the light guide assembly of FIG. 7A, according to aspects of the disclosure.
Figure 7B:
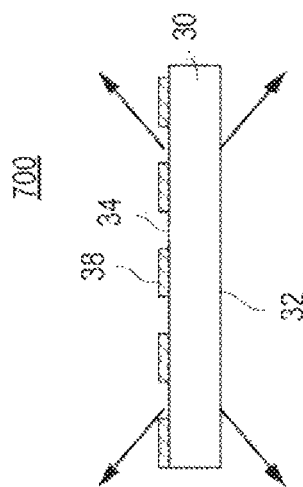
FIG. 7B is a schematic side view of the light guide assembly of FIG. 7A, according to aspects of the disclosure.
Figure 7A:
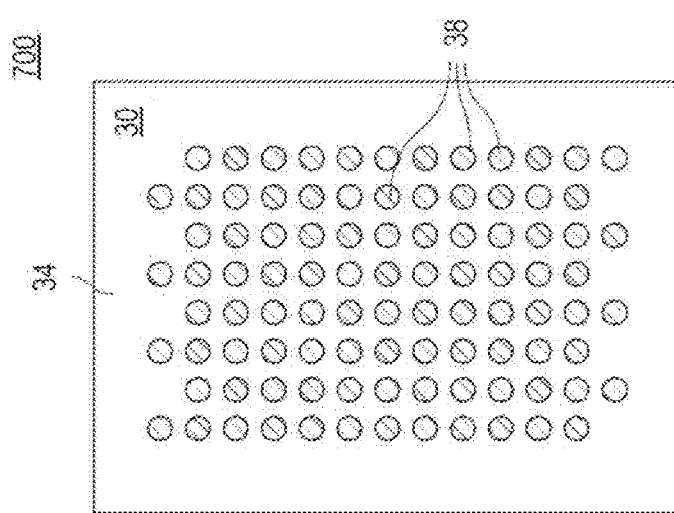
FIG. 7A is a schematic top-down view of an example of a light guide assembly, according to aspects of the disclosure.

FIGS. 7A-B are diagrams of an example of a light guide assembly 700, according to aspects of the disclosure. The light guide assembly 700 includes a light guide 30 and a plurality of light extraction elements 38 formed on the surface 34 of the light guide 30, as shown. FIG. 7C is a candela diagram showing the light distribution pattern produced by the light guide assembly 700. As illustrated, the light guide assembly 700 is configured to produce a batwing light distribution pattern in both the upward and downward directions.

As discussed above, the light extraction elements 36, when used alone, tend to produce a Lambertian light distribution pattern (e.g., see FIGS. 4A-C), whereas the light extraction elements 38 tend to produce a batwing light distribution pattern when used alone (e.g., see FIGS. 5A-C). In some aspects, the light distribution pattern produced by a particular light guide may be fine-tuned by selectively mixing the light extraction elements 36 and 38. For example, introducing a minority of light extraction elements 38 in a light guide that includes a majority of light extraction elements 36 may produce a modified Lambertian light distribution pattern that has a slightly wider spread than otherwise (e.g., see FIGS. 8A-C). Similarly, introducing a minority of light extraction elements 36 in a light guide that includes a majority of light extraction elements 38 may produce a modified batwing light distribution pattern that has a more pronounced middle section than otherwise (e.g., see FIGS. 9A-C).

Figure 8C:
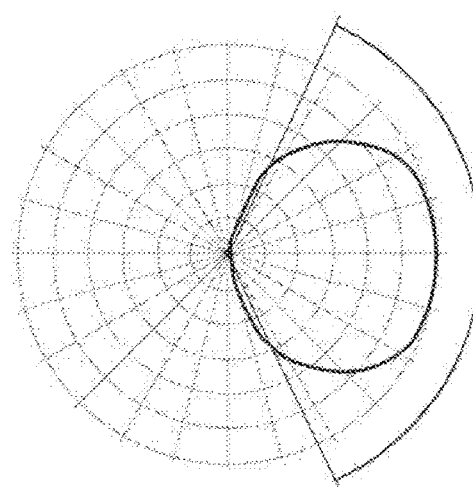
FIG. 8C is a candela diagram illustrating a light distribution pattern produced by the light guide assembly of FIG. 8A, according to aspects of the disclosure.
Figure 8B:
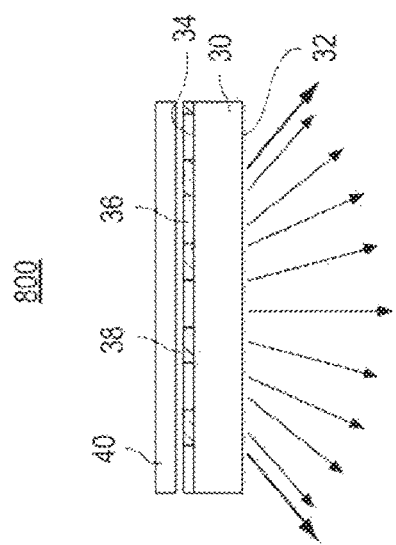
FIG. 8B is a schematic side view of the light guide assembly of FIG. 8A, according to aspects of the disclosure.
Figure 8A:
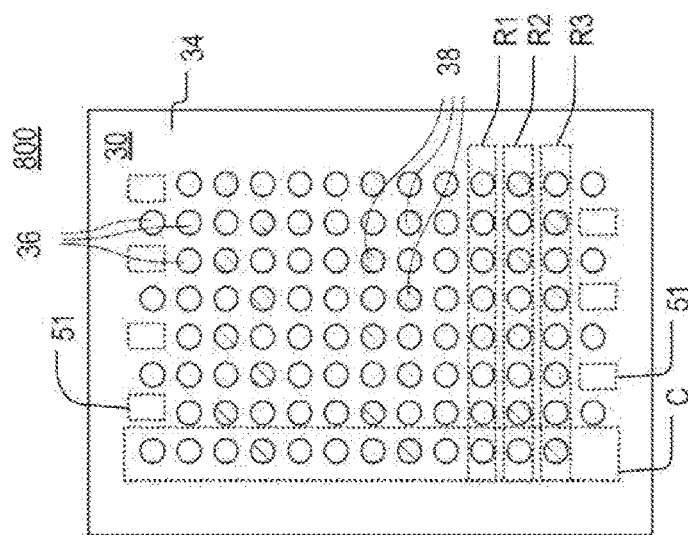
FIG. 8A is a schematic top-down view of an example of a light guide assembly, according to aspects of the disclosure.

FIGS. 8A-B are diagrams of an example of a light guide assembly 800, according to aspects of the disclosure. The light guide assembly 800 includes a light guide 30 and a diffusive reflector 40 disposed adjacently to a surface 34 of the light guide 30. A light extraction pattern is formed on the surface 34 of the light guide 30 that includes both light extraction elements 36 and light extraction elements 38. FIG. 8C is a candela diagram showing the light distribution pattern produced by the light guide assembly 800. As illustrated, the light guide assembly 800 is configured to produce a modified Lambertian light distribution pattern in the downward direction.

The light extraction pattern of the light guide assembly 800 includes a plurality of columns C. Each column C may include an alternating sequence of three light extraction elements 36 followed by one light extraction element 38. Each column C may be shifted with respect to its neighboring columns C by one spot 51 which may roughly correspond to the footprint of an individual light extraction element. Alternatively, the light extraction pattern of the light guide assembly 800 can be described as an alternating sequence including two rows R1 followed by one row R2 and one row R3. Each row R1 may include only light extraction elements 36. Each row R2 may include an alternating sequence of one light extraction element 36 followed by one light extraction element 38. Each row R3 may include an alternating sequence of one light extraction element 38 followed by one light extraction element 36. In some aspects, both light extraction elements 36 and 38 may be distributed uniformly across the surface 34 of the light guide 30, with the light extraction elements 36 having a three-times greater distribution density than the light extraction elements 38.

According to aspects of the disclosure, all light extraction elements 36 in the light guide assembly 800 may have the same shape (e.g., a circular or dot shape) and the same size (e.g., a size in the range of 0.01 mm-3 mm). Additionally or alternatively, all light extraction elements 38 in the light guide assembly 800 may have the same shape (e.g., a circular or dot shape) and the same size (e.g., a size in the range of 0.01 mm-3 mm). Moreover, in the example of FIGS. 8A-C, each light extraction element 36 has the same size and/or shape as any of the light extraction elements 38. However, alternative implementations are possible in which each of the light extraction elements 36 has a different size than any of the light extraction elements 38. Additionally or alternatively, further implementations are possible in which each of the light extraction elements 36 has a different shape than any of the light extraction elements 38. As discussed above, in some implementations, the light extraction elements 36 may differ in their respective light reflectance and transmittance. By way of example, each of the light extraction elements 38 may have 45% light reflectance and 55% light transmittance, and a 15° Gaussian diffusion pattern, and the light extraction elements 36 may each have 90% light reflectance and 10% light transmittance. Furthermore, in some implementations, each of the light extraction elements 36 and/or 38 may have a uniform reflectance and transmittance. And still furthermore, in some implementations, each of the light extraction elements 36 and 38 may be non-fluorescent.

As noted above, unlike the light guide assembly 400, the light extraction pattern of the light guide assembly 800 includes a minority of light extraction elements 38 that are interleaved with a majority of light extraction elements 36. The interleaving of a minority the light extraction elements 38 with a majority of light extraction elements 36 may result in a wider Lambertian light distribution pattern. This concept is illustrated by FIGS. 4C and 8C which show that the light distribution pattern of the light guide assembly 800 has a slightly wider emission spread than the light distribution pattern of the light guide assembly 400.

Figure 9A:
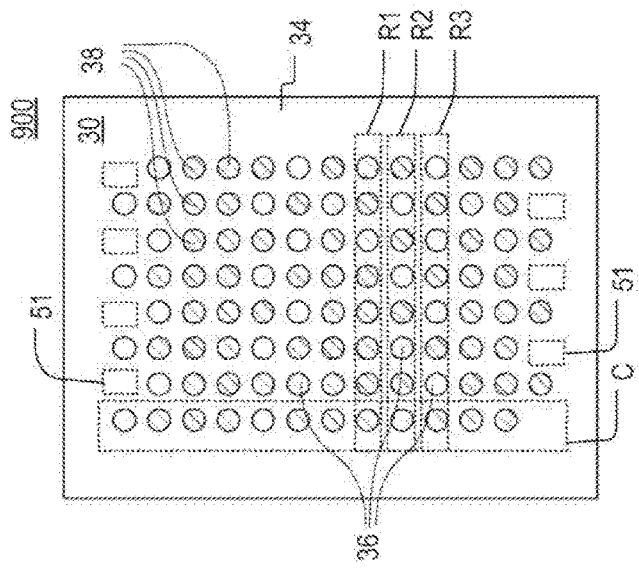
FIG. 9A is a schematic top-down view of an example of a light guide assembly, according to aspects of the disclosure.
Figure 9B:
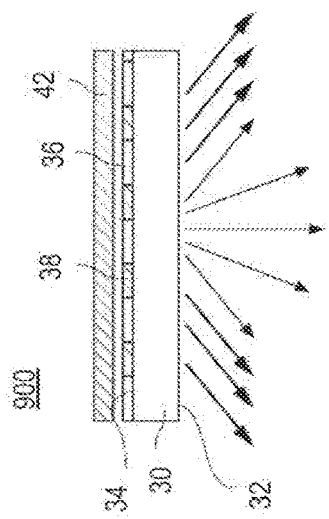
FIG. 9B is a schematic side view of the light guide assembly of FIG. 9A, according to aspects of the disclosure.
Figure 9C:
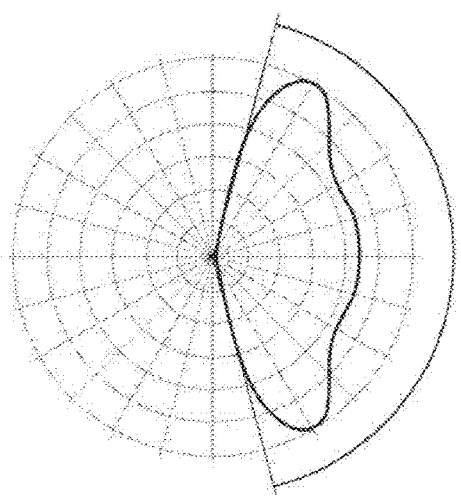
FIG. 9C is a candela diagram illustrating a light distribution pattern produced by the light guide assembly of FIG. 9A, according to aspects of the disclosure.

FIGS. 9A-B are diagrams of an example of a light guide assembly 900, according to aspects of the disclosure. The light guide assembly 900 includes a light guide 30 and a specular reflector 42 disposed adjacently to a surface 34 of the light guide 30. A light extraction pattern is formed on the surface 34 of the light guide 30 that includes both light extraction elements 36 and light extraction elements 38. FIG. 9C is a candela diagram showing the light distribution pattern produced by the light guide assembly 900. As illustrated, the light guide assembly 800 is configured to produce a modified batwing light distribution pattern in the downward direction.

The light extraction pattern of the light guide assembly 900 includes a plurality of columns C. Each column C includes an alternating sequence of three light extraction elements 38 followed by one light extraction element 36. Each column C is shifted with respect to its neighboring columns C by one spot 51 which may roughly correspond to the footprint of an individual light extraction element. Alternatively, the light extraction pattern of the light guide assembly 900 can be described as an alternating sequence including two rows R1 followed by one row R2 and one row R3. Each row R1 may include only light extraction elements 38. Each row R2 may include an alternating sequence of one light extraction element 36 followed by one light extraction element 38. Each row R3 may include an alternating sequence of one light extraction element 38 followed by one light extraction element 36. In some aspects, both the light extraction elements 36 and 38 may be distributed uniformly across the surface 34 of the light guide 30, with the light extraction elements 36 having a three-times greater distribution density than the light extraction elements 38.

According to aspects of the disclosure, all light extraction elements 36 in the light guide assembly 900 may have the same shape (e.g., a circular or dot shape) and the same size (e.g., a size in the range of 0.01 mm-3 mm). Additionally or alternatively, all light extraction elements 38 in the light guide assembly 900 may have the same shape (e.g., a circular or dot shape) and the same size (e.g., a size in the range of 0.01 mm-3 mm). Moreover, in the example of FIGS. 9A-C, each light extraction element 36 has the same size and/or shape as any of the light extraction elements 38. However, alternative implementations are possible in which each of the light extraction elements 36 has a different size than any of the light extraction elements 38. Additionally or alternatively, further implementations are possible in which each of the light extraction elements 36 has a different shape than any of the light extraction elements 38. As discussed above, in some implementations, the light extraction elements 36 may differ in their respective light reflectance and transmittance. By way of example, each of the light extraction elements 38 may have 45% light reflectance and 55% light transmittance, and a 15° Gaussian diffusion pattern, and the light extraction elements 36 may each have 90% light reflectance and 10% light transmittance. Furthermore, in some implementations, each of the light extraction elements 36 may have a uniform reflectance and transmittance. Similarly, in some implementations, each of the light extraction elements 38 may have a uniform reflectance and transmittance. And still furthermore, in some implementations, each of the light extraction elements 36 and 38 may be non-fluorescent.

As noted above, unlike the light guide assembly 500, the light extraction pattern of the light guide assembly 900 includes a minority of light extraction elements 36 that are interleaved with a majority of light extraction elements 38. The interleaving of a minority the light extraction elements 36 with a majority of light extraction elements 38 results in a modified batwing light distribution pattern which has a more pronounced middle section. This concept is illustrated by FIGS. 5C and 9C which show that the light distribution pattern of the light guide assembly 900 has a more pronounced middle section than the light distribution pattern of the light guide assembly 500.

In the examples of FIGS. 8A-C and 9A-C, the light extraction elements 36 are interleaved with the light extraction elements 38. However, in some implementations, the light extraction elements 36 and 38 may be segregated into separate groups, each group including light extraction elements of one kind only (e.g., see FIGS. 10A-C and FIGS. 11A-C). Any two neighboring groups may be spaced apart from one another by a distance that is greater than the distance between any two light extraction elements within any of the groups. Each group may include any number of light extraction elements. Furthermore, each group may be oriented in any direction relative to the light guide it is printed on (e.g., oriented along the length of the light guide, oriented along the width of the light guide, etc.). FIGS. 10A-C and FIGS. 11A-C, which are discussed further below, provide specific examples of light extraction patterns in which the light extraction elements 36 and 38 are organized into separate groups.

Figure 10C:
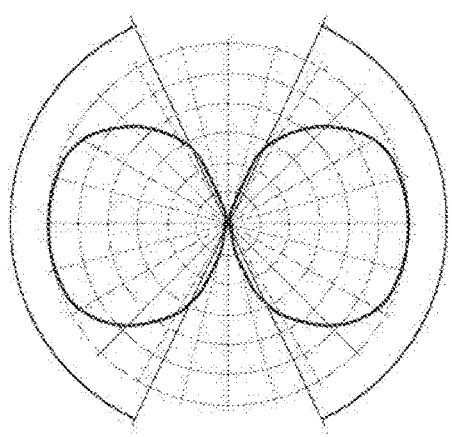
FIG. 10C is a candela diagram illustrating a light distribution pattern produced by the light guide assembly of FIG. 10A, according to aspects of the disclosure.
Figure 10B:
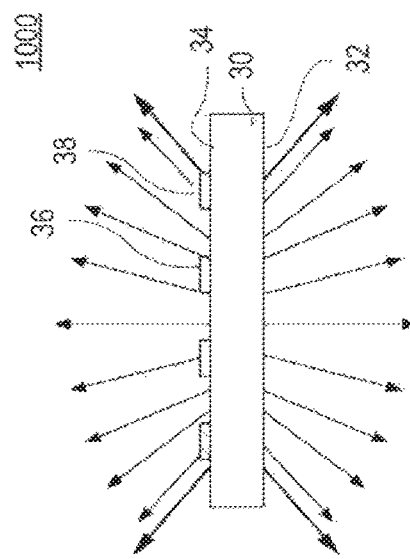
FIG. 10B is a schematic side view of the light guide assembly of FIG. 10A, according to aspects of the disclosure.
Figure 10A:
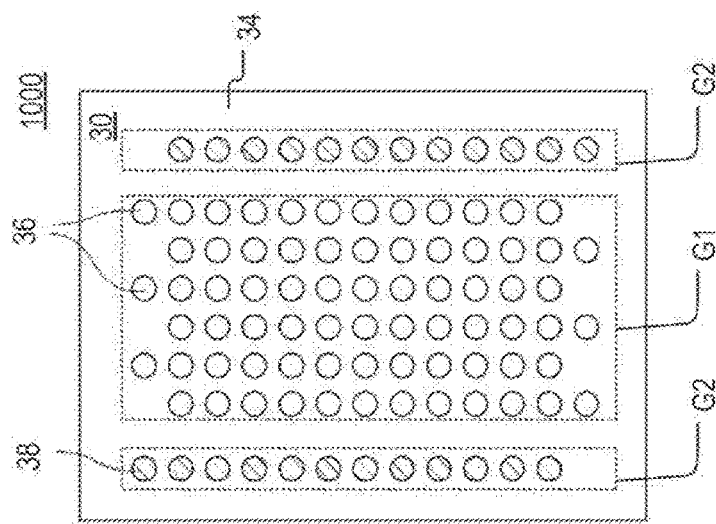
FIG. 10A is a schematic top-down view of an example of a light guide assembly, according to aspects of the disclosure.

FIGS. 10A-B are diagrams of an example of a light guide assembly 1000, according to aspects of the disclosure. The light guide assembly 1000 includes a light guide 30 and a light extraction pattern formed on a surface 34 of the light guide 30. The light extraction pattern includes a group G1 of light extraction elements 36 disposed between two groups G2 of light extraction elements 38. Although in the present example the group G1 includes six columns of light extraction elements, alternative implementations are possible in which the group G1 includes any number of columns of light extraction elements (e.g., 1, 2, 5, 15, etc.). Although in the present example the groups G2 each include one column of light extraction elements, alternative implementations are possible in which each of the groups G2 includes any number of columns of light extraction elements (e.g., 2, 4, 7, etc.). Although in the present example the light extraction pattern of the light guide 30 includes only three groups of light extraction elements (e.g., two groups G2 and one group G1 of light extraction elements), alternative implementations are possible in which the light guide 30 includes any number of light extraction element groups (e.g., 2, 4, 5, 10, 15, etc.).

FIG. 10C is a candela diagram showing the light distribution pattern produced by the light guide assembly 1000. As illustrated, the light guide assembly 1000 is configured to produce a modified Lambertian light distribution pattern both in the upward and downward directions. This light distribution pattern has a wider emission spread than the light distribution pattern produced by the light guide assembly 600. This difference is attributable to the introduction of a minority of light extraction elements 38 that are arranged in groups along opposite edges of the light guide 30. Although in the present example, the groups G2 are arranged along the longer edges of the light guide 30, alternative implementations are possible in which the groups G2 are arranged along the shorter edges.

According to aspects of the disclosure, all light extraction elements 36 in the light guide assembly 1000 may have the same shape (e.g., a circular or dot shape) and the same size (e.g., a size in the range of 0.01 mm-3 mm). Additionally or alternatively, all light extraction elements 38 in the light guide assembly 1000 may have the same shape (e.g., a circular or dot shape) and the same size (e.g., a size in the range of 0.01 mm-3 mm). Moreover, in the example of FIGS. 10A-C, each light extraction element 36 has the same size and/or shape as any of the light extraction elements 38. However, alternative implementations are possible in which each of the light extraction elements 36 has a different size than any of the light extraction elements 38. Additionally or alternatively, further implementations are possible in which each of the light extraction elements 36 has a different shape than any of the light extraction elements 38. As discussed above, in some implementations, the light extraction elements 36 may differ in their respective light reflectance and transmittance. By way of example, each of the light extraction elements 38 may have 45% light reflectance and 55% light transmittance, and a 15° Gaussian diffusion pattern, and the light extraction elements 36 may each have 90% light reflectance and 10% light transmittance. Furthermore, in some implementations, each of the light extraction elements 36 may have a uniform reflectance and transmittance. Similarly, in some implementations, each of the light extraction elements 38 may have a uniform reflectance and transmittance. And still furthermore, in some implementations, each of the light extraction elements 36 and 38 may be non-fluorescent.

Figure 11C:
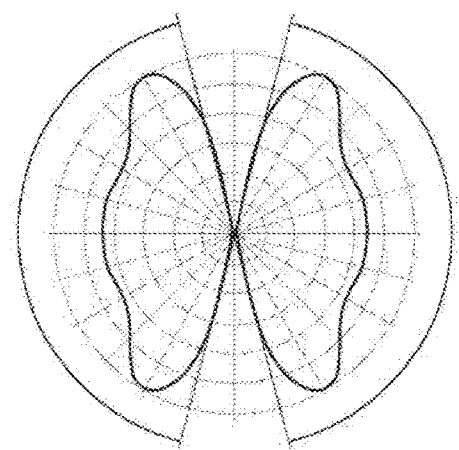
FIG. 11C is a candela diagram illustrating a light distribution pattern produced by the light guide assembly of FIG. 11A, according to aspects of the disclosure.
Figure 11B:
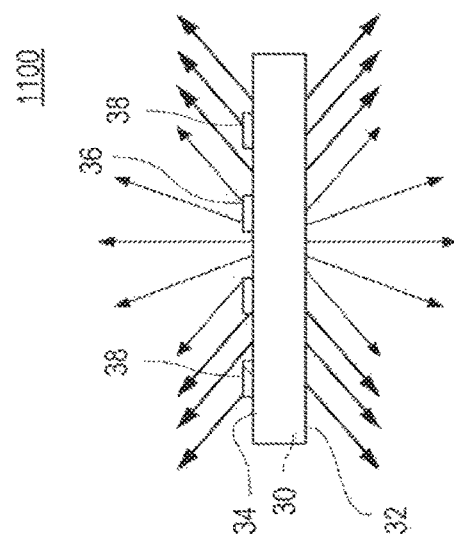
FIG. 11B is a schematic side view of the light guide assembly of FIG. 11A, according to aspects of the disclosure.
Figure 11A:
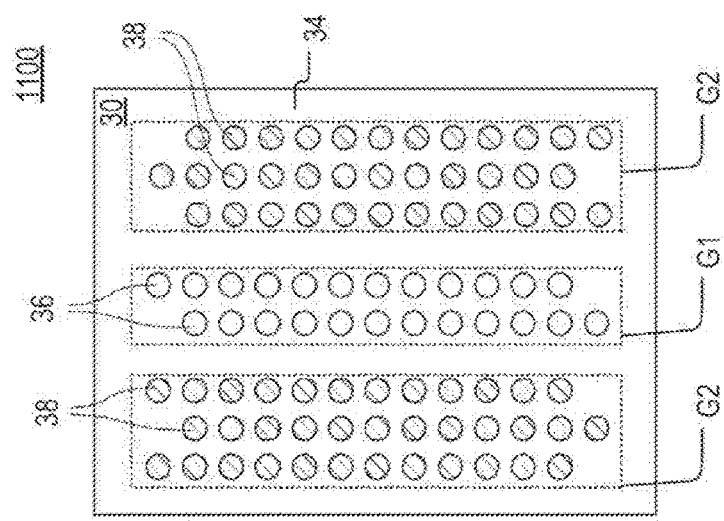
FIG. 11A is a schematic top-down view of an example of a light guide assembly, according to aspects of the disclosure.

FIGS. 11A-B are diagrams of an example of a light guide assembly 1100, according to aspects of the disclosure. The light guide assembly 1100 includes a light guide 30 and a light extraction pattern formed on the surface 34 of the light guide 30. The light extraction pattern includes a group G1 of light extraction elements 36 disposed between two groups G2 of light extraction elements 38. Although in the present example the group G1 includes two columns of light extraction elements, alternative implementations are possible in which the group G1 includes any number of columns of light extraction elements (e.g., 1, 5, 7, etc.). Although in the present example the groups G2 each include three columns of light extraction elements, alternative implementations are possible in which each of the groups G2 includes any number of columns of light extraction elements (e.g., 2, 4, 7, etc.). Although in the present example the light extraction pattern of the light guide 30 includes only three groups of light extraction elements, alternative implementations are possible in which the light guide 30 includes any number of light extraction element groups (e.g., 2, 4, 5, 10, 15, etc.).

FIG. 11C is a candela diagram showing the light distribution pattern produced by the light guide assembly 1100. As illustrated, the light guide assembly 1100 is configured to produce a modified batwing pattern in both the upward and downward directions. This light distribution pattern has a more pronounced middle section than the light distribution pattern produced by the light guide assembly 700. This difference is attributable to the introduction of a minority of light extraction elements 38 that are grouped in the middle of the light guide 30.

According to aspects of the disclosure, all light extraction elements 36 in the light guide assembly 1100 may have the same shape (e.g., a circular or dot shape) and the same size (e.g., a size in the range of 0.01 mm-3 mm). Additionally or alternatively, all light extraction elements 38 in the light guide assembly 1100 may have the same shape (e.g., a circular or dot shape) and the same size (e.g., a size in the range of 0.01 mm-3 mm). Moreover, in the example of FIGS. 11A-C, each light extraction element 36 has the same size and/or shape as any of the light extraction elements 38. However, alternative implementations are possible in which each of the light extraction elements 36 has a different size than any of the light extraction elements 38. Additionally or alternatively, further implementations are possible in which each of the light extraction elements 36 has a different shape than any of the light extraction elements 38. As discussed above, in some implementations, the light extraction elements 36 may differ in their respective light reflectance and transmittance By way of example, each of the light extraction elements 38 may have 45% light reflectance and 55% light transmittance, and a 15° Gaussian diffusion pattern, and the light extraction elements 36 may each have 90% light reflectance and 10% light transmittance. Furthermore, in some implementations, each of the light extraction elements 36 may have a uniform reflectance and transmittance. Similarly, in some implementations, each of the light extraction elements 38 may have a uniform reflectance and transmittance. And still furthermore, in some implementations, each of the light extraction elements 36 and 38 may be non-fluorescent.

In the examples discussed with respect to FIGS. 10A-C and FIGS. 11A-C, the upward emissions produced by the light guide assemblies 1000 and 1100, respectively, have the same distribution than the emissions produced in the downward direction. However, alternative implementations are possible in which reflectors that only partially cover the surface(s) of the light guide 30 are used to produce upward and downward emissions that have different distributions. One such example is discussed further below with respect to FIGS. 12A-C.

Figure 12C:
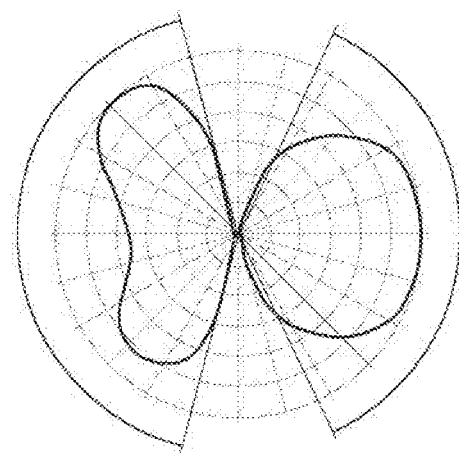
FIG. 12C is a candela diagram illustrating a light distribution pattern produced by the light guide assembly of FIG. 12A, according to aspects of the disclosure.
Figure 12B:
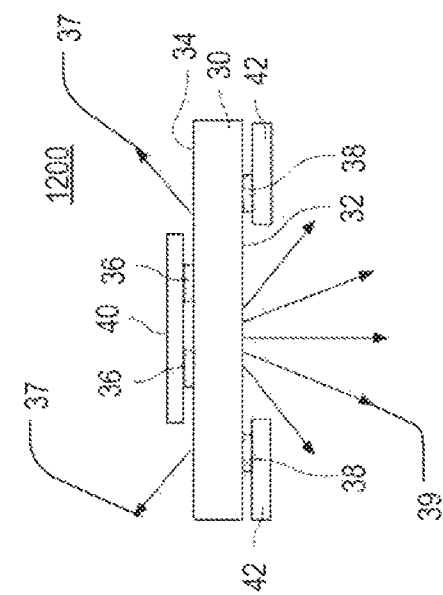
FIG. 12B is a schematic side view of the light guide assembly of FIG. 12A, according to aspects of the disclosure.
Figure 12A:
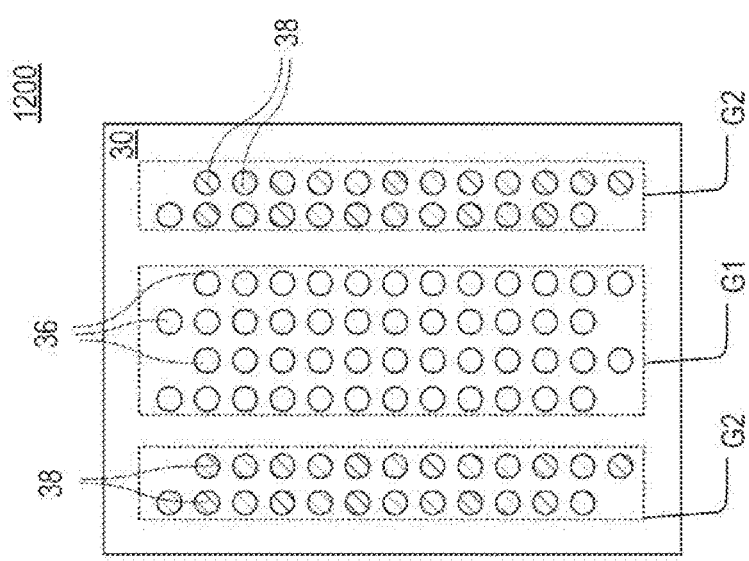
FIG. 12A is a schematic top-down view of an example of a light guide assembly, according to aspects of the disclosure.

FIGS. 12A-B are diagrams of an example of a light guide assembly 1200, according to aspects of the disclosure. The light guide assembly 1200 includes the light guide 30 and a light extraction pattern formed on the surfaces 32 and 34 of the light guide 30. The light extraction pattern includes a group G1 of light extraction elements 36 disposed between two groups G2 of light extraction elements 38. In the present example, the groups G2 of light extraction elements 38 are formed on the surface 32 of the light guide 30, whereas the group G1 of light extraction elements 36 is formed on the surface 34 of the light guide 30.

A different specular reflector 42 is placed over each of the groups G2 on the surface 32 of the light guide 30. Each of the specular reflectors 42 covers only a portion of the surface 32 of the light guide 30. Furthermore, each of the specular reflectors 42 covers the entire group G2 it is placed over. For example, each specular reflector 42 may be situated directly above/below each of the light extraction elements 38 in one of the groups G2 without extending under/over any of the light extraction elements 36 in group G1. In the present example, light 37 that is extracted by the light extraction elements 38 is reflected by specular reflectors 42 towards the surface 34 of the light guide 30.

Furthermore, a diffusive reflector 40 is placed over group G1 on the surface 34 of the light guide 30, as shown. The diffusive reflector 40 covers only a portion of the surface 34 of the light guide 30 and it may be situated directly above/below each of the light extraction elements 36 without extending under/over any of the light extraction elements 38. In the present example, light 39 that is extracted by the light extraction elements 36 is reflected by the diffusive reflector 40 towards the surface 32 of the light guide 30.

Although in the present example the groups G1 and G2 of light extraction elements are printed on different surfaces of the light guide 30, alternative implementations are possible in which they are printed on the same surface. Although in the present example the group G1 includes four columns of light extraction elements, alternative implementations are possible in which the group G1 includes any number of columns of light extraction elements (e.g., 1, 5, 7, etc.). Although in the present example the groups G2 each include two columns of light extraction elements, alternative implementations are possible in which each of the groups G2 includes any number of columns of light extraction elements (e.g., 1, 4, 7, etc.).

FIG. 12C is a candela diagram showing the light distribution pattern produced by the light guide assembly 1200. As illustrated, the light guide assembly 1200 is configured to produce a batwing light distribution in the upward direction and a Lambertian light distribution in the downward direction. The batwing light distribution is produced by the groups G2 of light extraction elements 38 in cooperation with the specular reflectors 42, whereas the Lambertian light distribution is produced by the group G1 of light extraction elements 36 in cooperation with the diffusive reflector 40.

According to aspects of the disclosure, all light extraction elements 36 in the light guide assembly 1200 may have the same shape (e.g., a circular or dot shape) and the same size (e.g., a size in the range of 0.01 mm-3 mm). Additionally or alternatively, all light extraction elements 38 in the light guide assembly 1200 may have the same shape (e.g., a circular or dot shape) and the same size (e.g., a size in the range of 0.01 mm-3 mm). Moreover, in the example of FIGS. 12A-C, each light extraction element 36 has the same size and/or shape as any of the light extraction elements 38. However, alternative implementations are possible in which each of the light extraction elements 36 has a different size than any of the light extraction elements 38. Additionally or alternatively, further implementations are possible in which each of the light extraction elements 36 has a different shape than any of the light extraction elements 38. As discussed above, in some implementations, the light extraction elements 36 may differ in their respective light reflectance and transmittance. By way of example, each of the light extraction elements 38 may have 45% light reflectance and 55% light transmittance, and a 15° Gaussian diffusion pattern, and the light extraction elements 36 may each have 90% light reflectance and 10% light transmittance. Furthermore, in some implementations, each of the light extraction elements 36 may have a uniform reflectance and transmittance. Similarly, in some implementations, each of the light extraction elements 38 may have a uniform reflectance and transmittance. And still furthermore, in some implementations, each of the light extraction elements 36 and 38 may be non-fluorescent.

Although in the present example the light extraction pattern of the light guide 30 includes only three groups of light extraction elements, alternative implementations are possible in which the light guide 30 includes any number of light extraction element groups (e.g., 2, 4, 5, 10, 15, etc.). In such instance, each group may be provided with a separate reflector that is configured to reflect light extracted by the group in one of the upward and downward directions.

Figure 13C:
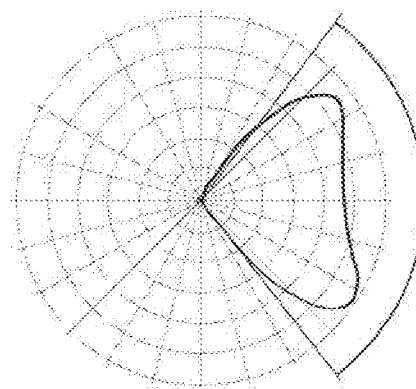
FIG. 13C is a candela diagram illustrating a light distribution pattern produced by the light guide assembly of FIG. 13A, according to aspects of the disclosure.
Figure 13B:
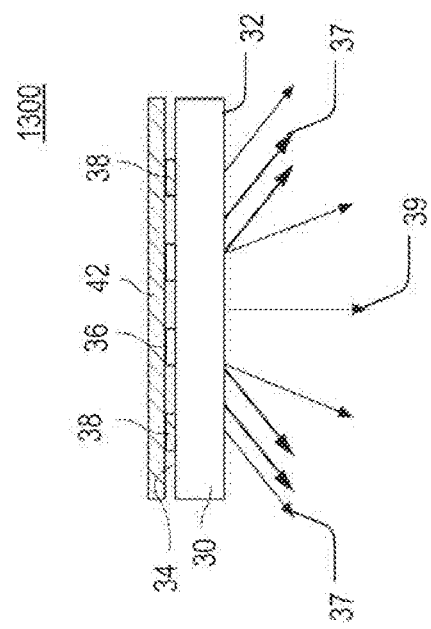
FIG. 13B is a schematic side view of the light guide assembly of FIG. 13A, according to aspects of the disclosure.
Figure 13A:
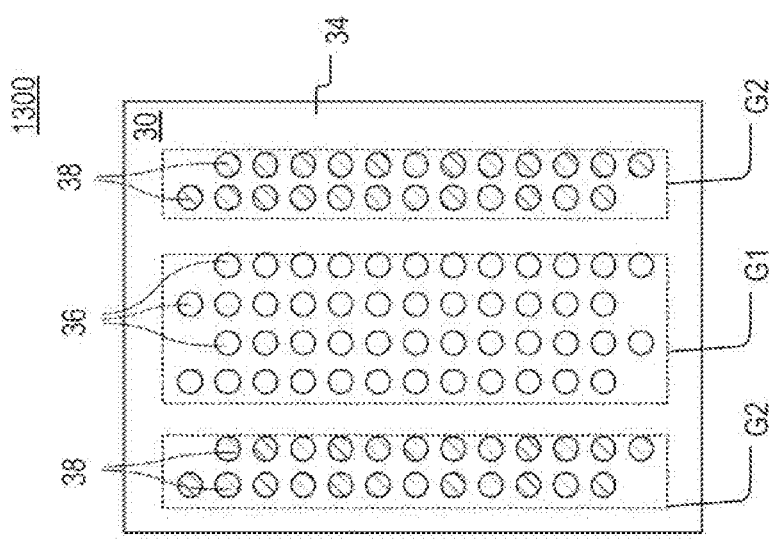
FIG. 13A is a schematic top-down view of an example of a light guide assembly, according to aspects of the disclosure.

FIGS. 13A-B are diagrams of an example of a light guide assembly 1300, according to aspects of the disclosure. The light guide assembly 1300 includes a light guide 30 and a light extraction pattern formed on a surface 34 of the light guide 30. The light extraction pattern includes a group G1 of light extraction elements 36 disposed between two groups G2 of light extraction elements 38. A specular reflector 42 is disposed on the surface 34 of the light guide and arranged to cover the groups G1 and G2. As a result, light 37 and 39 that is extracted by the light extraction elements 38 and 36, respectively, is reflected down towards the surface 32 of the light guide 30, as shown.

Although in the present example the group G1 includes four columns of light extraction elements, alternative implementations are possible in which the group G1 includes any number of columns of light extraction elements (e.g., 1, 5, 7, etc.). Although in the present example the groups G2 each include two columns of light extraction elements, alternative implementations are possible in which each of the groups G2 includes any number of columns of light extraction elements (e.g., 1, 4, 7, etc.). Although in the present example the groups G1 and G2 extend along the length of the light guide 30, alternative implementations are possible in which the groups G1 and G2 extend along the width of the light guide 30.

FIG. 13C is a candela diagram showing the light distribution pattern produced by the light guide assembly 1300. As illustrated, the light guide assembly 1300 is operable to produce a light distribution pattern in the downward direction only. The produced light distribution pattern is a hybrid between a Lambertian light distribution pattern and a batwing light distribution pattern. The shape of the light distribution pattern is the result of combining a batwing light distribution pattern produced by the groups G2 of light extraction elements 38 (which may have the same distribution as the upward emissions shown in FIG. 12C) with a Lambertian light distribution pattern produced by the group G1 of light extraction elements 36 (which may have the same distribution as the downward emissions shown in FIG. 12C).

According to aspects of the disclosure, all light extraction elements 36 in the light guide assembly 1300 may have the same shape (e.g., a circular or dot shape) and the same size (e.g., a size in the range of 0.01 mm-3 mm). Additionally or alternatively, all light extraction elements 38 in the light guide assembly 1300 may have the same shape (e.g., a circular or dot shape) and the same size (e.g., a size in the range of 0.01 mm-3 mm). Moreover, in the example of FIGS. 13A-C, each light extraction element 36 has the same size and/or shape as any of the light extraction elements 38. However, alternative implementations are possible in which each of the light extraction elements 36 has a different size than any of the light extraction elements 38. Additionally or alternatively, further implementations are possible in which each of the light extraction elements 36 has a different shape than any of the light extraction elements 38. As discussed above, in some implementations, the light extraction elements 36 may differ in their respective light reflectance and transmittance. By way of example, each of the light extraction elements 38 may have 45% light reflectance and 55% light transmittance, and a 15° Gaussian diffusion pattern, and the light extraction elements 36 may each have 90% light reflectance and 10% light transmittance. Furthermore, in some implementations, each of the light extraction elements 36 may have a uniform reflectance and transmittance. Similarly, in some implementations, each of the light extraction elements 38 may have a uniform reflectance and transmittance. And still furthermore, in some implementations, each of the light extraction elements 36 and 38 may be non-fluorescent.

Figure 14:
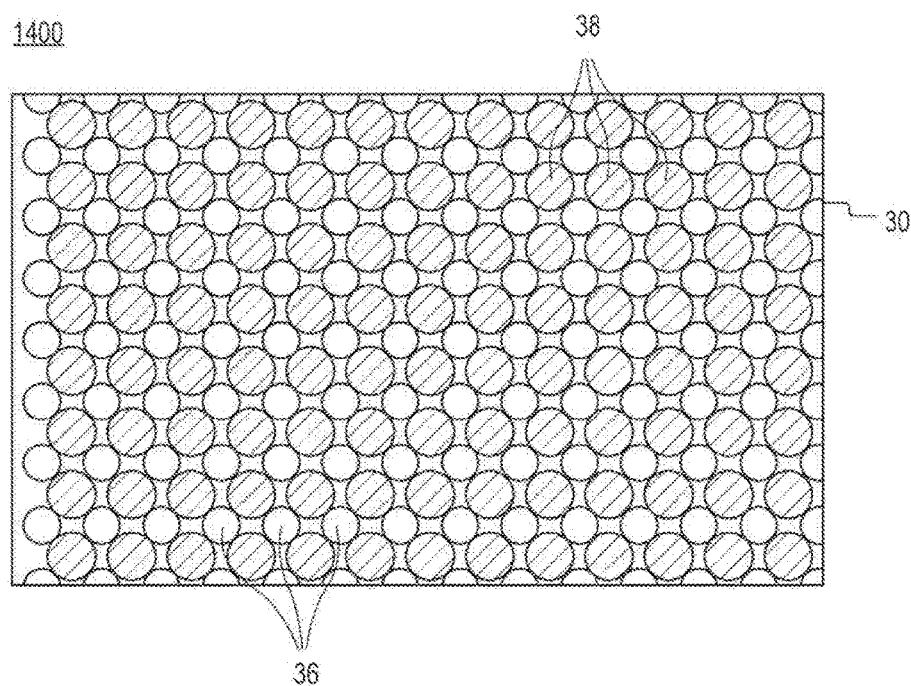
FIG. 14 is a schematic top-down view of an example of a light guide assembly, according to aspects of the disclosure.

FIG. 14 is a diagram of an example of a light guide assembly 1400, according to aspects of the disclosure. The light guide assembly 1400 includes the light guide 30 having a light extraction pattern formed thereon. The light extraction pattern includes a first grid pattern of light extraction elements 36 and a second grid pattern of light extraction elements 38. Each of the light extraction elements 36, except for those adjacent to the edges of the light guide 30, is positioned in a different interstice between four different light extraction elements 38. As used throughout the disclosure, the term "grid pattern" relates to an arrangement of light extraction elements in which the light extraction elements are arranged in vertical lines next to each other to form a matrix including a plurality of vertical columns and horizontal rows. Other examples of grid patterns are shown in FIGS. 4A-13A.

In some implementations, the light extraction elements 36 and the light extraction elements may be arranged on the same surface of the light guide 30. Alternatively, in some implementations the light extraction elements 36 may be arranged on a first surface of the light guide 30, and the light extraction elements 36 may be arranged on a second surface of the light guide 30 that is opposite the first surface.

According to aspects of the disclosure, all light extraction elements 36 in the light guide assembly 1400 may have the same shape (e.g., a circular or dot shape) and the same size (e.g., a size in the range of 0.01 mm-3 mm). Additionally or alternatively, all light extraction elements 38 in the light guide assembly 1400 may have the same shape (e.g., a circular or dot shape) and the same size (e.g., a size in the range of 0.01 mm-3 mm). Moreover, in the example of FIG. 14, each light extraction element 36 has a different size and/or shape as any of the light extraction elements 38. However, alternative implementations are possible in which each of the light extraction elements 36 has the same size than any of the light extraction elements 38. Additionally or alternatively, further implementations are possible in which each of the light extraction elements 36 has a different shape than any of the light extraction elements 38. As discussed above, in some implementations, the light extraction elements 36 may differ in their respective light reflectance and transmittance. By way of example, each of the light extraction elements 38 may have 45% light reflectance and 55% light transmittance, and a 15° Gaussian diffusion pattern, and the light extraction elements 36 may each have 90% light reflectance and 10% light transmittance. Furthermore, in some implementations, each of the light extraction elements 36 may have a uniform reflectance and transmittance. Similarly, in some implementations, each of the light extraction elements 38 may have a uniform reflectance and transmittance. And still furthermore, in some implementations, each of the light extraction elements 36 and 38 may be non-fluorescent.

Figure 15:
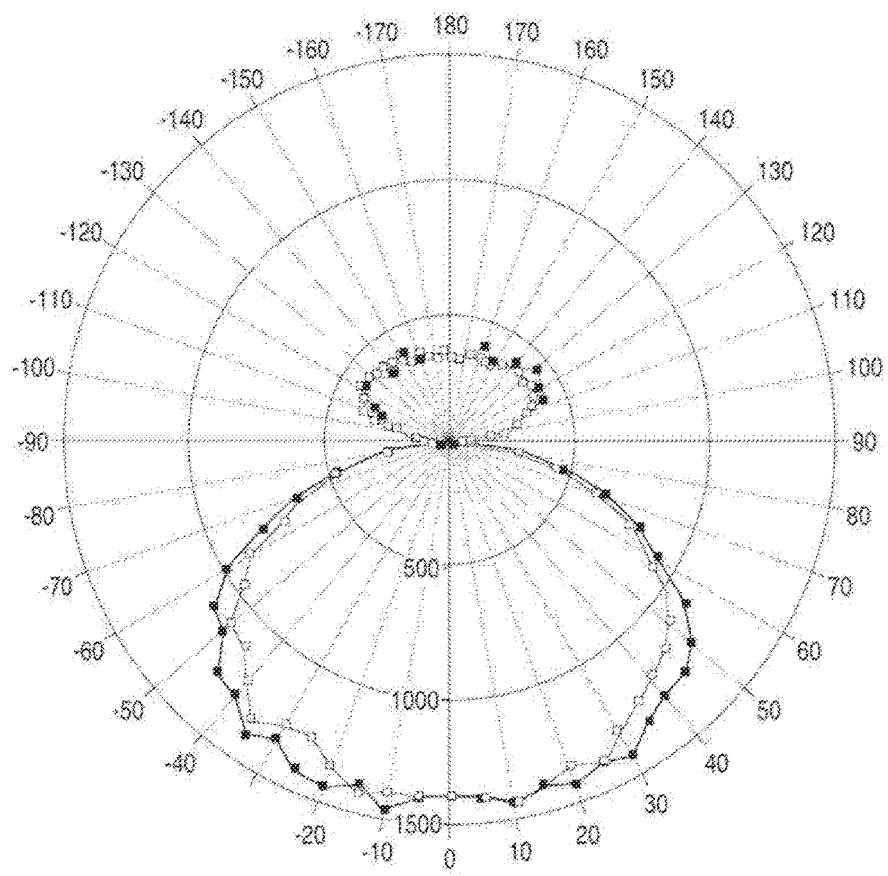
FIG. 15 is a candela diagram illustrating a light distribution pattern produced by the light guide assembly of FIG. 14, according to aspects of the disclosure.

FIG. 15 is a candela diagram showing the light distribution pattern produced by the light guide assembly 1400. As illustrated, the light guide assembly 1400 is configured to produce a batwing light distribution in the upward direction and a Lambertian light distribution in the downward direction. Approximately 30% of the light emitted by the light guide assembly 1400 is directed upwards, while 70% of the light emitted by the light guide assembly 1400 is directed downwards. In some implementations, the ratio of upward light to downward light may be increased or decreased by changing at least one of: (i) the relative size of the light extraction elements 36 and 38, (ii) the area covered by each of the light extraction elements 36 and 38, and (iii) the distribution density of the light extraction elements 36 and 38. In some implementations, the distribution density of the light extraction elements 36 or 38 may be based on (e.g., equal to) the count of light extraction elements per unit area (e.g., cm$^2$).

FIGS. 1-15 are provided as an example only. Although in the examples provided with respect to FIGS. 1-15, the light extraction elements 36 and 38 are arranged in straight lines to form a rectangular matrix, alternative implementations are possible in which the light extraction elements 36 are arranged in any suitable manner. For example, the light extraction elements 36 and 38 may be arranged in other arrays besides rectangular matrices. As another example, the light extraction elements 36 and 38, in any of the light guide assemblies discussed above, may be arranged in random or pseudo-random arrangements. As yet another example, the light extraction elements 36 and 38, in any of the light guide assemblies discussed above, may be arranged patterns that cover an entire surface(s) of the light guide 30 without there being any gaps between them that are not covered. As can readily be appreciated, in instances in which an entire surface of the light guide 30 is covered, the light extraction elements 36 and 38 may have different shapes. Furthermore, in any of the examples discussed above, at least one light extraction element 36 in a given light guide assembly may have a different size and/or shape than another light extraction element 36 in the same light guide assembly. Similarly, in any of the examples discussed above, at least one light extraction element 38 in a given light guide assembly may have a different size and/or shape than another light extraction element 38 in the same light guide assembly.

At least some of the elements discussed with respect to these figures can be arranged in different order, combined, and/or altogether omitted. It will be understood that the provision of the examples described herein, as well as clauses phrased as "such as," "e.g.", "including", "in some aspects," "in some implementations," and the like should not be interpreted as limiting the disclosed subject matter to the specific examples.

Having described the invention in detail, those skilled in the art will appreciate that, given the present disclosure, modifications may be made to the invention without departing from the spirit of the inventive concepts described What is being claimed is:

1. A light-emitting system, comprising:
a light guide configured to guide light received from a light source;
a first light extraction element positioned on a first surface of the light guide and configured to extract a portion of the guided light from the light guide, the first light extraction element having a first reflectance and a first transmittance; and
a second light extraction element positioned on the first surface of the light guide and configured to extract a portion of the guided light from the light guide, the second light extraction element having a second reflectance different from the first reflectance, the second light extraction element having a second transmittance different from the first transmittance.

2. The light-emitting system of claim 1, wherein:
the first light extraction element being printed on the first surface of the light guide with a first ink; and
the second light extraction element being printed on the first surface of the light guide with a second ink different from the first ink.

3. The light-emitting system of claim 1, wherein the first light extraction element is configured such that light extracted from the light guide by the first light extraction element has an angular distribution that is approximately Lambertian.

4. The light-emitting system of claim 1, wherein the first reflectance and the first transmittance sum to about 100%.

5. The light-emitting system of claim 1, wherein the first reflectance is about 90% and the first transmittance is about 10%.

6. The light-emitting system of claim 1, wherein the second light extraction element is configured such that light extracted from the light guide by the second light extraction element has an angular distribution that is approximately batwing.

7. The light-emitting system of claim 1, wherein the second reflectance and the second transmittance sum to about 100%.

8. The light-emitting system of claim 1, wherein the second reflectance is about 45% and the second transmittance is about 55%.

9. The light-emitting system of claim 8, wherein the second light extraction element is configured to have a Gaussian diffusion pattern of about 15 degrees.

10. The light-emitting system of claim 1, wherein:
the first light extraction element is configured such that light extracted from the light guide by the first light extraction element has an angular distribution that is approximately Lambertian;
the second light extraction element is configured such that light extracted from the light guide by the second light extraction element has an angular distribution that is approximately batwing; and
the first surface of the light guide is configured such that light extracted from the light guide by the first light extraction element and the second light extraction element, combined, has an angular distribution that is wider than Lambertian and narrower than batwing.

11. The light-emitting system of claim 1, further comprising:
a first plurality of light extraction elements positioned on the first surface of the light guide, the first plurality of light extraction elements including the first light extraction element, each light extraction element of the first plurality having a reflectance that equals the first reflectance and a transmittance that equals the first transmittance; and
a second plurality of light extraction elements positioned on the first surface of the light guide, the second plurality of light extraction elements including the second light extraction element, each light extraction element of the second plurality having a reflectance that equals the second reflectance and a transmittance that equals the second transmittance.

12. The light-emitting system of claim 11, wherein:
the first plurality of light extraction elements are configured such that light extracted from the light guide by each first light extraction element has an angular distribution that is approximately Lambertian;
the second plurality of light extraction elements are configured such that light extracted from the light guide by each second light extraction element has an angular distribution that is approximately batwing; and
the first surface of the light guide is configured such that light extracted from the light guide by the first plurality of light extraction elements and the second plurality light extraction elements, combined, has an angular distribution that is wider than Lambertian and narrower than batwing.

13. The light-emitting system of claim 1, further comprising the light source, the light source configured to inject light into the light guide through an edge of the light guide.

14. The light-emitting system of claim 1, further comprising the light source, the light source being positioned in a cavity in the light guide and configured to inject light into the light guide through one or more walls of the cavity.

15. A method for emitting light, the method comprising:
receiving, with a light guide, light from a light source;
guiding, with the light guide, a first portion of the received light to a first light extraction element positioned on a first surface of the light guide, the first light extraction element having a first reflectance and a first transmittance;
extracting, from the light guide, a second portion of the light with the first light extraction element;
guiding, with the light guide, a third portion of the received light to a second light extraction element positioned on the first surface of the light guide, the second light extraction element having a second reflectance different from the first reflectance, the second light extraction element having a second transmittance different from the first transmittance; and
extracting, from the light guide, a fourth portion of the light with the second light extraction element.

16. The method of claim 15, wherein:
the second portion comprises the first portion, multiplied by the first transmittance; and
the fourth portion comprises the third portion, multiplied by the second transmittance.

17. The method of claim 15, further comprising:
reflecting, with the first light extraction element, a fifth portion of light such that the fifth portion remains in the light guide; and
reflecting, with the second light extraction element, a sixth portion of light such that the sixth portion remains in the light guide.

18. The method of claim 17, wherein:
the fifth portion comprises the first portion, multiplied by the first reflectance; and the sixth portion comprises the third portion, multiplied by the second reflectance.

19. The method of claim 15, wherein the second light extraction element is configured to have a Gaussian diffusion pattern of about 15 degrees, and further comprising:
   angularly broadening the light with the second light extraction element, such that the fourth portion of the light has an angular distribution that is wider than an angular distribution of the second portion of the light.

20. A light-emitting system, comprising:
   a light source configured to produce light;
   a light guide configured to receive light from the light source and guide the received light;
   a plurality of first light extraction elements positioned on a first surface of the light guide, each first light extraction element configured to extract a portion of the guided light from the light guide, the first light extraction elements having a same first reflectance and a same first transmittance, each first light extraction element being printed on the first surface with a first ink; and
   a plurality of second light extraction elements positioned on the first surface of the light guide, each second light extraction element configured to extract a portion of the guided light from the light guide, each second light extraction element having a second reflectance different from the first reflectance, each second light extraction element having a second transmittance different from the first transmittance, each second light extraction element being printed on the first surface with a second ink different from the first ink.

* * * * *